(12) United States Patent
Huang et al.

(10) Patent No.: US 9,738,974 B2
(45) Date of Patent: Aug. 22, 2017

(54) SUSCEPTOR

(71) Applicant: Epistar Corporation, Hsinchu (TW)

(72) Inventors: Yuan-Hung Huang, Hsinchu (TW);
Chung-Kuei Huang, Hsinchu (TW);
Ai-Fa Lee, Hsinchu (TW); Shang-Po Chien, Hsinchu (TW); Meng-Tu Chiang, Hsinchu (TW); Chi-Ling Lee, Hsinchu (TW); Ying-Chun Chuang, Hsinchu (TW); Wen-Hsien Lo, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 236 days.

(21) Appl. No.: 14/790,631

(22) Filed: Jul. 2, 2015

(65) Prior Publication Data

US 2015/0345016 A1    Dec. 3, 2015

Related U.S. Application Data

(63) Continuation-in-part of application No. 14/293,539, filed on Jun. 2, 2014, now Pat. No. 9,396,983.

(51) Int. Cl.
*C23C 16/458* (2006.01)

(52) U.S. Cl.
CPC ................. *C23C 16/4585* (2013.01)

(58) Field of Classification Search
CPC ..... H91L 21/687; B23Q 16/001; B23Q 16/06; B23Q 2230/004
See application file for complete search history.

(56) References Cited

U.S. PATENT DOCUMENTS 9,396,983 B2 * 7/2016 Huang ............. H01L 21/68721
2015/0348822 A1 * 12/2015 Huang ............. H01L 21/68721
                                                                118/500

* cited by examiner

*Primary Examiner* — Lee D Wilson
(74) *Attorney, Agent, or Firm* — Ditthavong & Steiner, P.C.

(57) ABSTRACT

A susceptor, comprising: a base part; multiple holders distributed on the base part for accommodating wafers; an inner ring connected to the base part; and an outer ring detachably connected to the base part and separated from the inner ring; wherein the inner ring and the outer ring separate the holders from one another. A susceptor, comprising: a base part; multiple holders distributed on the base part for accommodating wafers; a cover comprising a first surface facing the base part, and a second surface opposite to the first surface; a first positioning structure; a second positioning structure formed in the first surface; and a third positioning structure formed in the base part, wherein the cover connects to the base part by associating the first positioning structure with the second positioning structure and the third positioning structure.

18 Claims, 15 Drawing Sheets

SUSCEPTOR

REFERENCE TO RELATED APPLICATION

This application is a continuation-in-part of U.S. patent application Ser. No. 14/293,539 entitled "SUSCEPTOR", filed on Jun. 2, 2014, the entire contents of which are incorporated herein by reference.

TECHNICAL FIELD

The disclosure relates to a susceptor, and more particularly to a susceptor with a prolonged lifetime for an epitaxial growth system.

DESCRIPTION OF BACKGROUND ART

Semiconductor optoelectronic devices contribute to data transmission and energy conversion along with the advance of technology. For example, the semiconductor optoelectronics devices are applicable to various systems such as the optical fiber communication, optical storage, and military system. In general, a process of forming semiconductor optoelectronic devices comprises steps of providing wafers, growing epitaxial layers, growing thin films, photolithography and etching.

In the mentioned processes, growing epitaxial layers are generally carried out by a chemical vapor deposition (CVD) system or a molecular beam epitaxy (MBE) system, wherein the CVD system is preferred in the semiconductor industry because of its higher production rate than the MBE system. A susceptor for holding wafers is used during a process of growing epitaxial layers in the CVD system. During the process of growing epitaxial layers, deposits accumulate on a surface of the susceptor. After several cycles, the deposits need to be removed to prevent from degrading the quality of the epitaxial layers. One of the methods for removing the deposits is to strike the surface of the susceptor so as to result in peeling the outermost surface off along with the deposits. However, such a method leads to a damage of the surface of the susceptor and to a reduction in the thickness of the susceptor, and thus the susceptor can not be re-used in consideration of the quality of the epitaxial layers. As a result, the susceptor expense is considerable. Another method for removing the deposits is to bake the susceptor for a period of time, such as about 8 hours. However, when baking the susceptor, the susceptor can not be used for growing epitaxial layers and thus the productivity is significantly reduced.

SUMMARY OF THE DISCLOSURE

The present disclosure provides a susceptor, comprising: a base part; multiple holders distributed on the base part for accommodating wafers; an inner ring connected to the base part; and an outer ring detachably connected to the base part and separated from the inner ring; wherein the inner ring and the outer ring separate the holders from one another.

The present disclosure provides a susceptor, comprising: a base part; multiple holders distributed on the base part for accommodating wafers; a cover comprising a first surface facing the base part, and a second surface opposite to the first surface; a first positioning structure; a second positioning structure formed in the first surface; and a third positioning structure formed in the base part, wherein the cover connects to the base part by associating the first positioning structure with the second positioning structure and the third positioning structure.

DETAILED DESCRIPTION OF PREFERRED EMBODIMENTS

Figure 1:
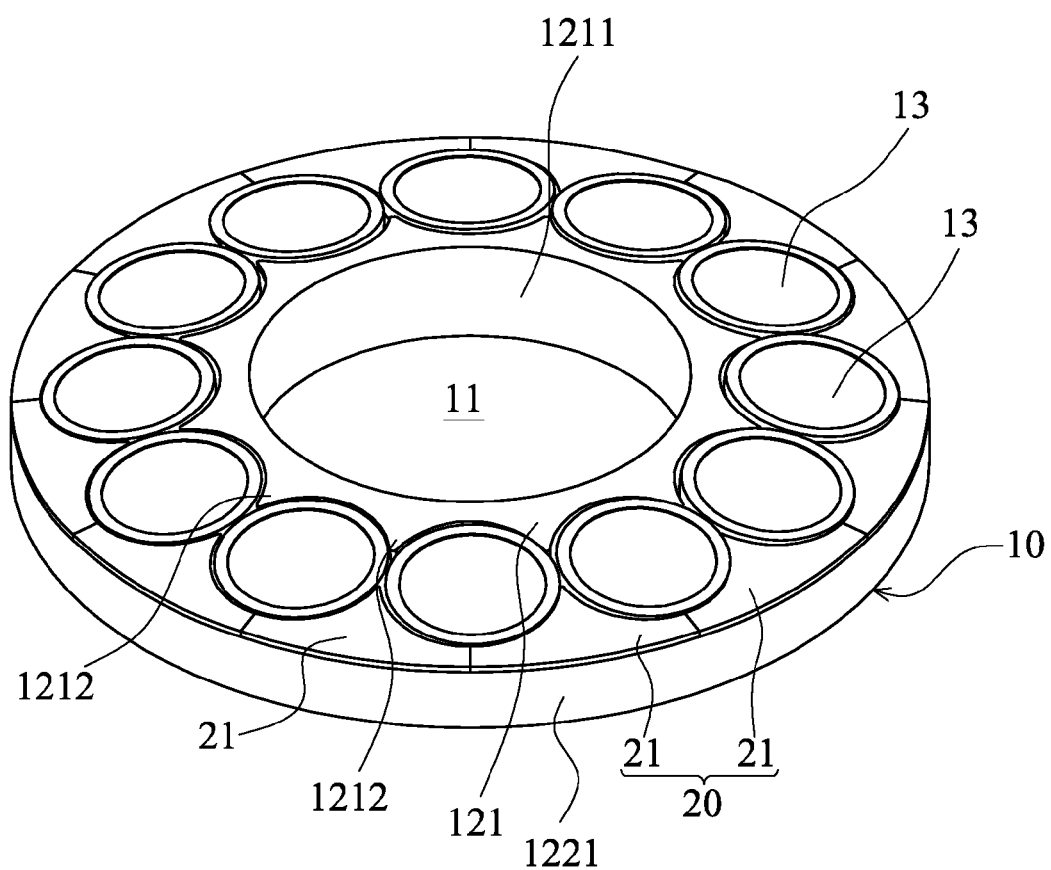
FIG. 1 illustrates a susceptor in accordance with one of the embodiments of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

Figure 2:
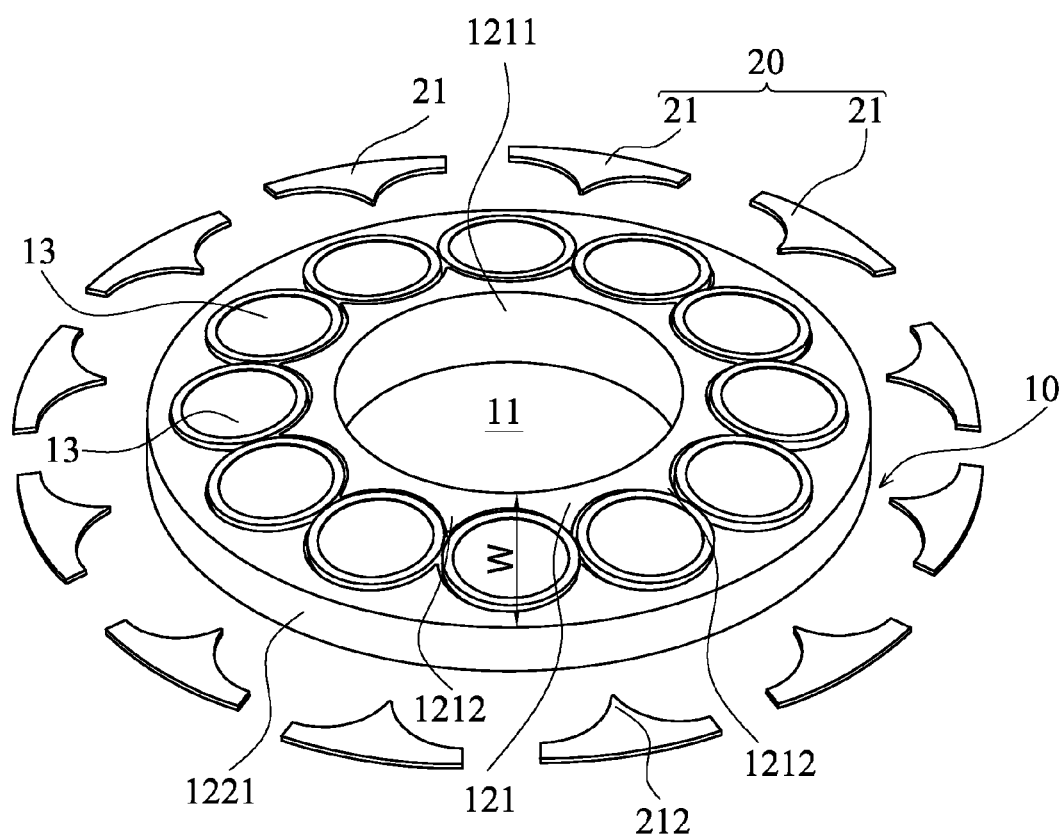
FIG. 2 illustrates an exploded view of a susceptor in accordance with one of the embodiments of the present application.
Figure 3:
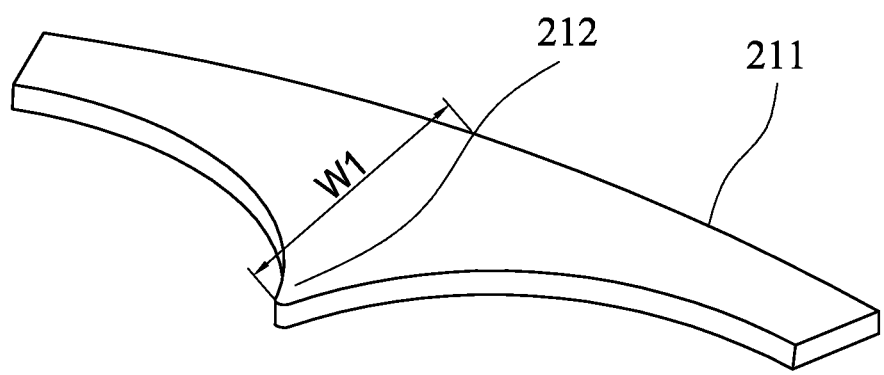
FIG. 3 illustrates a sub-element of a susceptor in accordance with one of the embodiments of the present application.

FIG. 1 illustrates a susceptor in accordance with one of the embodiments of the present application. FIG. 2 illustrates an exploded view of a susceptor in accordance with one of the embodiments of the present application. Referring to FIG. 1 to FIG. 2, a susceptor in accordance with one of the embodiments of the present application comprises a base part 10, multiple holders 13 distributed circularly on the base part 10 and are separated from one another, and a cover (not shown) comprising an inner ring 121 connected to the base part 10 and an outer ring 20 detachably connected to the base part 10 and separated from the inner ring 121, wherein the holders 13 are for accommodating wafers. In the present embodiment, the base part 10 comprises an inner side 1211 surrounding a through hole 11. As a result, the base part 10 is an annular ring having a radial width W. The cover (not shown) comprising the inner ring 121 and the outer ring 20 separates the holders 13 from one another. In the present embodiment, the inner ring 121 is integrally formed with the base part 10, and therefore a thickness of the part of the base part 10 which is integrally formed with the inner ring 121 is greater than a thickness of other parts of the base part 10. The inner ring 121 further comprises multiple first extensions 1212 each protruding radially and outwardly toward the outer ring 20 and at a direction away from the through hole 11. The outer ring 20 is farther to the through hole 11 than the inner ring 121. The outer ring 20 comprises multiple sub-elements 21 detachably connected to the base part 10. The multiple sub-elements 21 have the same structure and are separated from one another. FIG. 3 illustrates a sub-element 21 of the susceptor in accordance with the present embodiment. Referring to FIG. 2 and FIG. 3, each sub-element 21 comprises an outermost edge 211 and a second extension 212 extending radially and inwardly from the outermost edge 211 toward the inner ring 121 and toward the through hole 11. Specifically, the second extension 212 of each sub-element 21 aligns with one of the first extensions 1212, and therefore the second extensions 212 and the first extensions 1212 separate the holders 13 from one another and surrounding the holders 13. In the present embodiment, the curvature of the outermost edge 211 of each sub-element 21 substantially matches the curvature of an outermost side 1221 of the base part 10. A maximum width w1 of each sub-element 21 is smaller than the radial width W of the base part 10. More preferable, the maximum width w1 of each sub-element 21 is not greater than a half of the radial width W of the base part 10. In the present embodiment, the second extension 212 of each sub-element 21 has the maximum width w1. Each sub-element 21 neighbors a part of one of the holders 13. That is to say, a single sub-element 21 does not surround any one of the holders 13 entirely. To be more specific, each sub-element 21 neighbors two holders 13. Besides, a material of the outer ring 20 comprises sapphire, boron nitride, quartz, silicon carbide or graphite. In one of the embodiments, the thickness of the outer ring 20 is greater than the thickness of the wafers. For example, the thickness of the outer ring 20 is at least 3 times as thick as that of the wafers. Specifically, the thickness of a wafer on the holder 13 ranges from 0.2 mm to 0.6 mm, and the thickness of each sub-element 21 of the outer ring 20 ranges from 1 mm to 9 mm. In one of the embodiments, the susceptor disclosed in the present application is used for growing epitaxial layers of compound such as AlGaInP instead of III-nitride compound. Because the susceptor disclosed in the present application comprises the outer ring 20 detachably connected to the base part 10, after the outer ring 20 is seriously damaged by striking to remove the deposits, only the damaged outer ring 20 needs to be removed instead of the entire susceptor, and thus the cost to maintain the susceptor is reduced. Furthermore, because the outer ring 20 comprises multiple sub-elements 21 having the same structure, if one of the sub-elements 21 is broken or accumulates too many deposits, another new sub-element 21 can replace the unwanted one instead of changing the whole outer ring 20 if it is integrated as a whole, and thus the cost to maintain the susceptor is significantly reduced. Also, the time-consuming baking method for removing the deposits becomes an option and is not necessarily required so the productivity is significantly increased.

Figure 4:
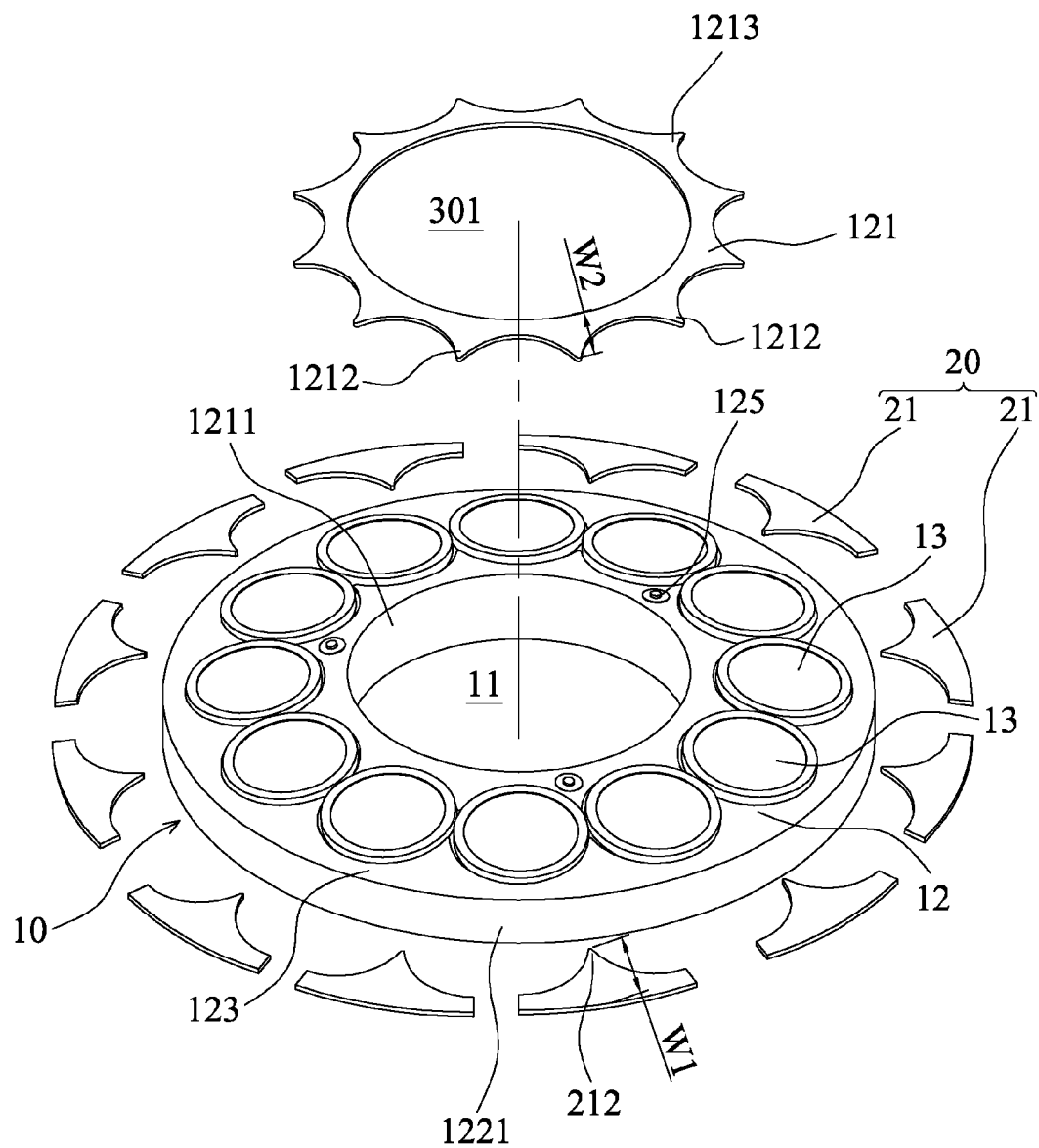
FIG. 4 illustrates an exploded view of a susceptor in accordance with one of the embodiments of the present application.
Figure 5:
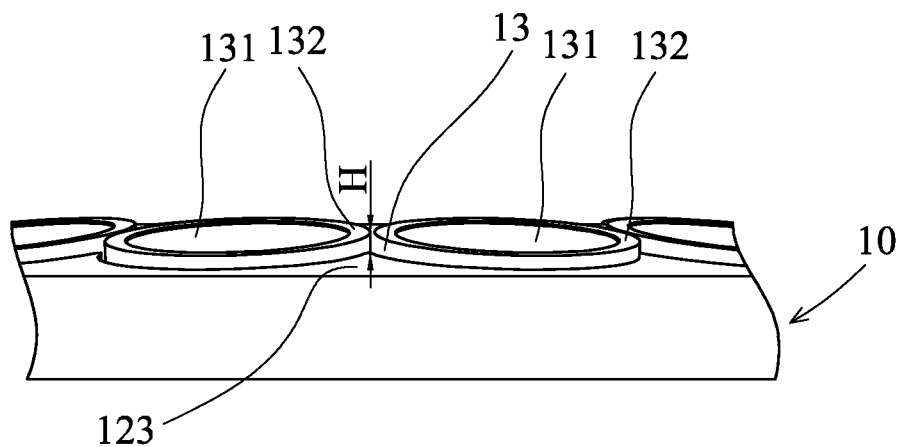
FIG. 5 is a side view showing a susceptor in accordance with one of the embodiments of the present application.

FIG. 4 illustrates an exploded view of a susceptor in accordance with one of the embodiments of the present application. FIG. 5 is a side view showing the susceptor in accordance with one of the embodiments of the present application. Referring to FIG. 1 and FIG. 4, in the present embodiment, the inner ring 121 is detachably connected to the base part 10 so the inner ring 121 can be separated from the base part 10 and the outer ring 20. The inner ring 121 comprises an aperture 301 formed through the center and aligned with the through hole 11 of the base part 10. In the present embodiment, the thickness of the part of the base part 10 where the inner ring 121 is disposed on is substantially the same as the thickness of the part of the base part 10 where the outer ring 20 is disposed on. Furthermore, each holder 13 is partially surrounded by the inner ring 121, and therefore each holder 13 is substantially entirely surrounded by the outer ring 20 and the inner ring 121. Besides, the number of the inner ring 121 is less than a number of the sub-elements 21. For example, in the present embodiment, the number of the inner ring 121 is one while the number of the sub-elements 21 is twelve. The inner ring 121 comprises a maximum width w2 smaller than the radial width W of the base part 10. More preferable, the maximum width w2 of the inner ring 121 is not greater than a half of the radial width W of the base part 10. In the present embodiment, the first extensions 1212 have the maximum width w2 of the inner ring. To be more specific, the second extensions 212 having the maximum width w1 align with the first extensions 1212 having the maximum width w2 respectively. Furthermore, the thickness of the inner ring 121 ranges from 1 mm to 9 mm, and the thickness of the inner ring 121 can be the same or different from the thickness of the sub-elements 21. Specifically, referring to FIG. 5, the base part 10 comprises an upper surface 123 facing and carrying the outer ring (not shown) and the inner ring (not shown). Each holder 13 comprises a top surface 131 and a rim 132 surrounding the top surface 131. Each wafer is kept in one of the holders 13 by sitting on the top surface 131 and being hold by the rim 132. A thickness of each sub-element 21 is equal to or smaller than a height H of the rim 132 measured from the upper surface 123. For example, the thickness of each sub-element 21 of the outer ring 20 ranges from 1 mm to 9 mm, and the height H of the rim 132 of the holder 13 ranges from 1 mm to 12 mm. Furthermore, a material of the inner ring 121 comprises sapphire, boron nitride, quartz, silicon carbide, or graphite.

Figure 6:
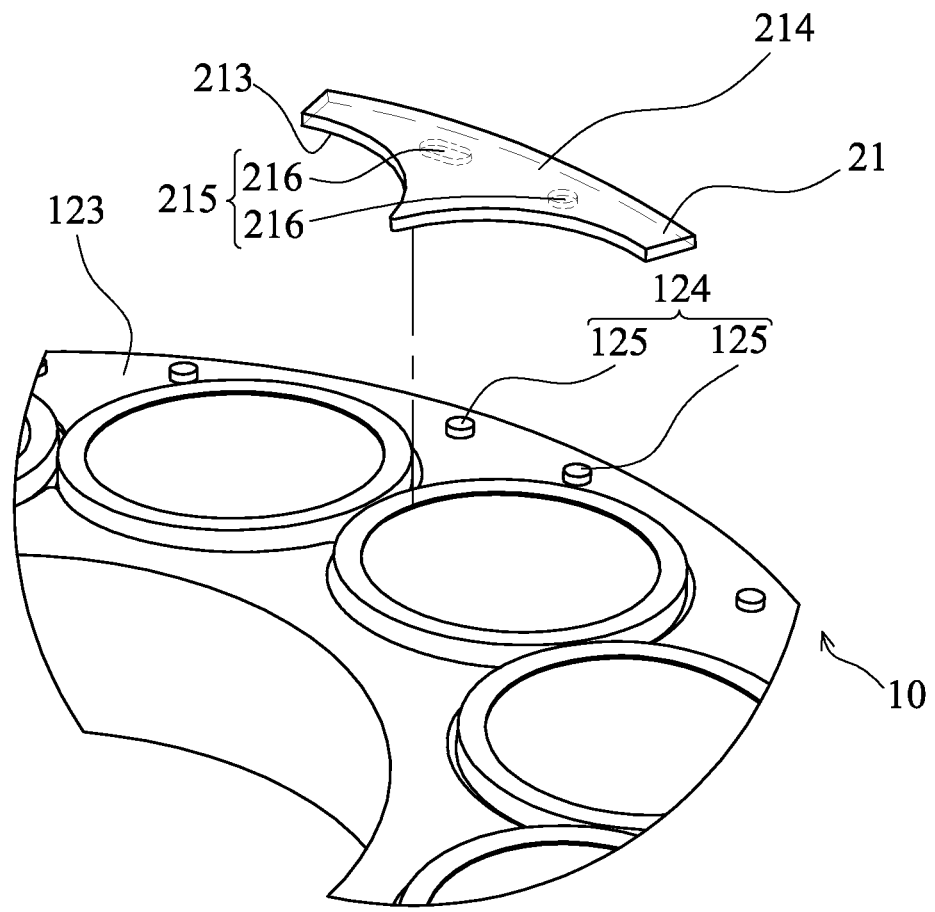
FIG. 6 illustrates a susceptor in accordance with one of the embodiments of the present application.

FIG. 6 illustrates a susceptor in accordance with one of the embodiments of the present application. Referring to FIG. 6, the base part 10 further comprises a first positioning structure 124 formed on the upper surface 123 of the base part 10 in a position corresponding to the sub-elements 21 of the cover. Each sub-element 21 of the cover comprises a first surface 213 facing the upper surface 123 of the base part 10, a second surface 214 opposite to the first surface 213 and a second positioning structure 215 formed in the first surface 213 and associated with the first positioning structure 124 for securing the sub-element 21 of the cover on the base part 10. In one of the embodiments, the first positioning structure 124 comprises multiple protrusions 125 each protruding from the upper surface 123, and the second positioning structure 215 comprises multiple recesses 216 each formed in the first surface 213, wherein each recess 216 is engaged with one of the protrusions 125 respectively. Specifically, a depth of each recess 216 is smaller than a distance between the first surface 213 and the second surface 214 and thus each recess 216 does not penetrate through the second surface 214 and thus the sub-elements 21 cover the protrusions 125 when the sub-elements 21 are attached to the base part 10. Accordingly, the deposits may not be deposited around the recesses 216 and the protrusions 125 in a CVD system. In one of the embodiments, multiple protrusions 125 are also formed in a position corresponding to the inner ring 121, and multiple recesses (not shown) are also formed in a surface (not shown) of the inner ring 121 facing the upper surface 123 to associate with the multiple protrusions 125 respectively, as shown in FIG. 4.

Next, comparative samples 1, 2, and 3 of chips are formed by using a conventional susceptor in a CVD system. Samples 1 to 10 of chips are formed by using a susceptor disclosed in the present application in a CVD system. The results are shown in Table 1.

TABLE 1

Results of Comparative samples 1 to 3 and samples 1 to 10

| Sample | Iv fail (%) | Wd fail (%) | Wd = 2 nm | Yield (%) |
| --- | --- | --- | --- | --- |
| Comparative sample 1 | 14.75 | 14.94 | 621.4~623.4 | 84.023 |
| Comparative sample 2 | 11.59 | 13.08 | 620.3~622.3 | 84.649 |
| Comparative sample 3 | 12.96 | 12.29 | 620.5~622.5 | 84.759 |
| Sample 1 | 12.16 | 11.76 | 620.6~622.6 | 85.548 |
| Sample 2 | 8.63 | 9.52 | 619.8~621.8 | 88.615 |
| Sample 3 | 8.61 | 11.26 | 620.6~622.6 | 88.209 |
| Sample 4 | 8.39 | 13 | 620.7~622.7 | 86.064 |
| Sample 5 | 9.33 | 11.57 | 619.6~621.9 | 87.694 |
| Sample 6 | 8.41 | 11.16 | 619.7~621.7 | 87.791 |
| Sample 7 | 8.55 | 9.36 | 621.2~623.2 | 89.588 |
| Sample 8 | 10.55 | 11.53 | 621.7~623.7 | 87.86 |
| Sample 9 | 8.55 | 10.46 | 621.9~623.9 | 87.96 |
| Sample 10 | 8.76 | 8.15 | 621.3~623.3 | 88.539 |

From Table 1, it is obvious that the results of samples 1 to 10 are much better than the results of the comparative samples 1 to 3 since the yields are higher and the percentages of Wd fail and the Iv fail are decreased. As a result, the susceptor disclosed in the present application is advantageous of growing epitaxial layers with improved quality and yield.

Figure 7:
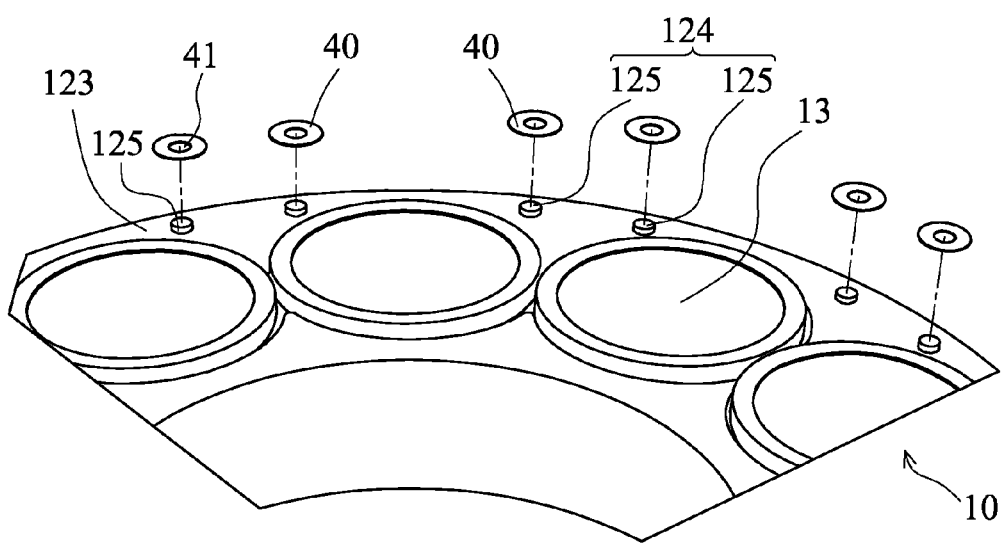
FIG. 7 illustrates a susceptor in accordance with one of the embodiments of the present application.

FIG. 7 illustrates a susceptor in accordance with one of the embodiments of the present application. Referring to FIG. 7, in the present embodiment, the susceptor further comprises multiple spacers 40 disposed and distributed between the outer ring 20 and the base part 10. Each spacer 40 comprises an opening 41 for associating with one of the protrusions 125 of the first positioning structure 124. A material of the spacers 40 comprises sapphire, boron nitride, quartz, silicon carbide, or graphite. The spacers 40 are used for adjusting a height measured from the upper surface 123 of the base part 10 to the first surface 213 of the sub-element 21 by stacking multiple spacers 40 between the upper surface 123 of the base part 10 and the sub-element 21. In addition, the spacers can also be disposed between the base part 10 and the inner ring 121 to adjust a gap between the base part 10 and the inner ring 121 as shown in FIG. 4. A conventional susceptor and three susceptors of different embodiments of the present application are used for growing epitaxial layers in a CVD system to compare the wavelength uniformity of the chips. The first susceptor as disclosed in present application is without spacers 40. The second susceptor disclosed in the present application comprises multiple protrusions 125 and each protrusion 125 is associated with one spacer 40. The third susceptor as disclosed in present application comprises multiple protrusions 125 and each protrusion 125 is associated with two spacers 40.

The standard deviations of the wavelength distribution of the epitaxial layers formed on the conventional susceptor, the first, second, and the third susceptor disclosed in the present application are 0.248%, 0.152%, 0.184% and 0.198%, respectively. As a result, by using the susceptor disclosed in the present application, the chips have better wavelength uniformity since the susceptor disclosed in the present application is advantageous of uniform heating during the process.

Figure 8A:
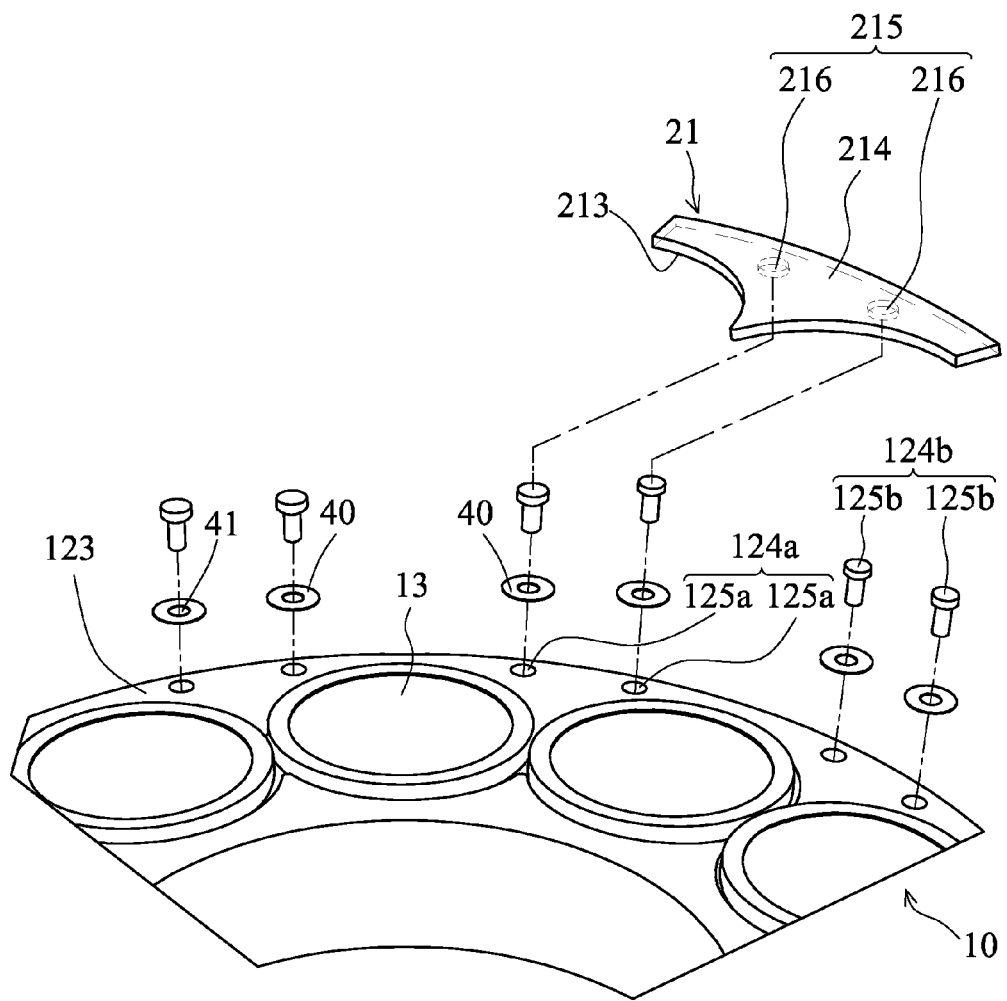
FIG. 8A illustrates a susceptor in accordance with one of the embodiments of the present application.

FIG. 8A illustrates a susceptor in accordance with one of the embodiments of the present application. A cover (not shown) of the susceptor comprises an outer ring comprising multiple sub-elements 21 detachably connected to the base part 10. Referring to FIG. 8A, in the present embodiment, a first positioning structure 124b comprises multiple pins 125b. The base part 10 further comprises a third positioning structure 124a comprising multiple second recesses 125a formed in the upper surface 123. The first positioning structure 124b is associated with the second positioning structure 215. In the embodiment, each pin 125b is inserted into each second recess 125a. The second positioning structure 215 comprises multiple first recesses 216 in the first surface 213 of the sub-element 21. The sub-element 21 is associated with the base part 10 via engaging the second positioning structure 215 with the replaceable first positioning structure 124b.

Figure 8B:
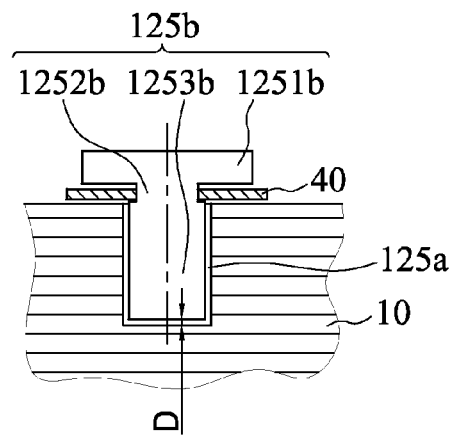
FIG. 8B illustrates a cross section view of a positioning structure of a susceptor in accordance with one of the embodiments of the present application.

FIG. 8B illustrates a cross section view of the pin 125b associated with the second recesses 125a. In the present embodiment, the upper portion 1251b of each pin 125b is associated with each first recess 216, and the lower portion 1253b of each pin 125b is associated with each second recess 125a. The pin 125b comprises a middle portion 1252b formed between an upper portion 1251b and a lower portion 1253b, and a width of the middle portion 1252b is smaller than a width of the upper portion 1251b and that of the lower portion 1253b of the pin 125b. In the present embodiment, the susceptor comprises multiple spacers 40 disposed and distributed between the outer ring 20 and the base part 10. Each spacer 40 comprises an opening 41 having a diameter substantially the same as that of the middle portion 1252b and the opening 41 is associated with the middle portion 1252b. Therefore, the spacer 40 can fit into the middle portion 1252b being as a buffer to reduce the impact coming from the sub-element 21. In one embodiment, a buffer space D is between the lower portion 1253b of the pin 125b and the second recess 125a to reduce the impact between the pin 125b and the second recess 125a which may cause some damages due to the repeated associated operation. The first positioning structure can be damaged due to the repeated associated operation, such as the first positioning structure broken or coating material on it peeling, and has to be replaced frequently to prevent contamination of wafers due to the damage. It is more effective to replace the protrusions 125 fixed with the base part 10 by the replaceable pins 125b to reduce the cost of consumable and increase the yield rate. In one embodiment, a height of the upper portion 1251b of the pin 125b is smaller than or equal to a depth of the first recess 216 and thus the sub-elements 21 completely cover the pins 125*b* and the base part 10 stably and prevent the deposits to be deposited around the first recesses 216 and the pins 125*b* in a CVD system. In one of the embodiments, multiple pins 125*b* are also formed in a position corresponding to the inner ring 121 as shown in the FIG. 4, and multiple second recesses 125*a*. The first recesses 216 can be formed in a surface (not shown) of the inner ring 121 facing the upper surface 123 to associate with the multiple pins 125*b* respectively, as a replacement of protrusions 125 shown in FIG. 4. The spacers 40 are used for adjusting a height measured from the upper surface 123 of the base part 10 to the second surface 213 of the sub-element 21 by stacking multiple spacers 40 between the upper surface 123 of the base part 10 and the sub-element 21. In addition, the spacers can also be disposed between the base part 10 and the inner ring 121 to adjust a gap between the base part 10 and the inner ring 121 as shown in FIG. 4. In one embodiment the pin 125*b* can only comprise an upper portion 1251*b* and a lower portion 1253*b* without the middle portion. The geometrical structures of the pin 125*b* are not limited to the embodiments, they can be replaced by different kind of modifications.

Figure 9A:
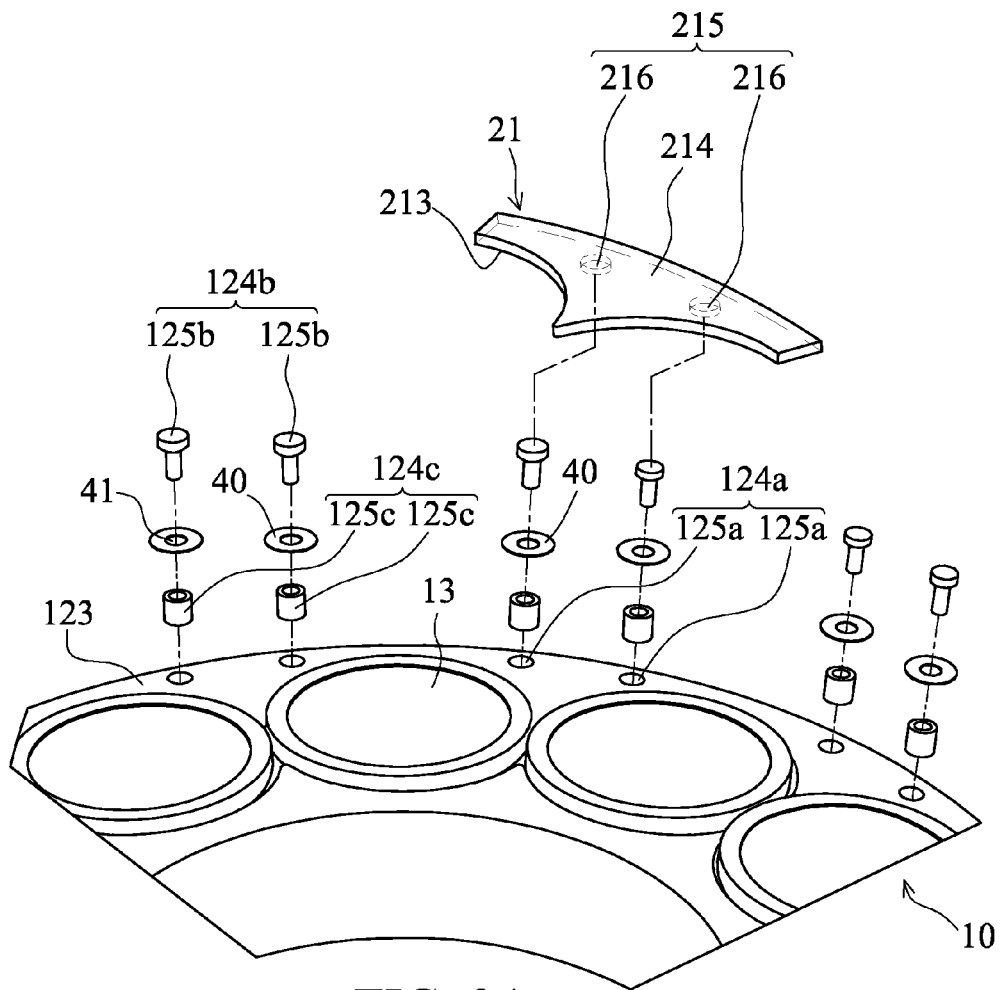
FIG. 9A illustrates a susceptor in accordance with one of the embodiments of the present application.

FIG. 9A illustrates a susceptor in accordance with one of the embodiments of the present application. A cover (not shown) of the susceptor comprises an outer ring comprising multiple sub-elements 21 detachably connected to the base part 10. Referring to FIG. 9A, in the present embodiment, the first positioning structure 124*b* comprising multiple pins 125*b*. A fourth positioning structure 124*c* is associated with the first positioning structure 124*b* and third positioning structure 124*a*. The fourth positioning structure 124*c* comprises multiple sockets 125*c* with a recess, wherein each pins 125*b* is associated with each socket 125*c*. The base part 10 further comprises a third positioning structure 124*a* comprising multiple second recesses 125*a* formed in the upper surface 123, wherein each socket 125*c* is associated with each second recess 125*a*. The second positioning structure 215 comprises multiple first recesses 216 formed in the first surface 213, wherein each sub-element 21 is associated with the base part 10 via engaging the second positioning structure 215 with the replaceable first positioning structure 124*b*, the replaceable fourth positioning structure 124*c*, and the third positioning structure 124*a*.

Figure 9B:
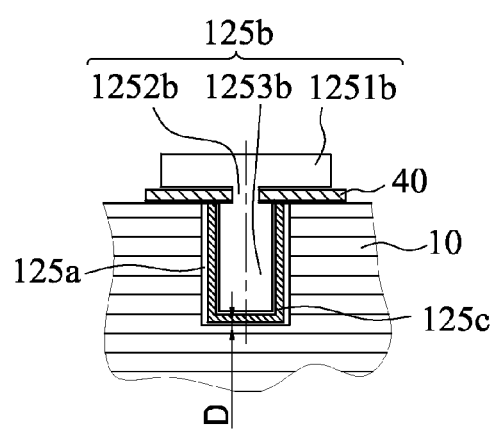
FIG. 9B illustrates a cross section view of a positioning structure of a susceptor in accordance with one of the embodiments of the present application.

FIG. 9B illustrates a cross section view of the pin 125*b* associated with the sockets 125*c* and the second recesses 125*a*. In one embodiment, the pin 125*b* comprises a middle portion 1252*b* formed between the upper portion 1251*b* and the lower portion 1253*b*, and a width of the middle portion 1252*b* is smaller than a width of the upper portion 1251*b* and that of the lower portion 1253*b*. In the present embodiment, the susceptor comprises multiple spacers 40 disposed and distributed between the outer ring 20 and the base part 10. Each spacer 40 comprises an opening 41 having a diameter substantially the same as that of the middle portion 1252*b* and the opening 41 is associated with the middle portion 1252*b*. Therefore, the spacer 40 can fit into the middle portion 1252*b* of the pin 125*b* being as a buffer to reduce the impact coming from the sub-element 21 which may causes some damages due to the repeated associated operation. The width of the upper portion 1251*b* of the pin 125*b* is larger than that of the lower portion 1253*b* of the pin 125*b*, and the width of the lower portion 1253*b* of the pin 125*b* is smaller than that of the recess of the sockets 125*c*, so that the upper portion 1251*b* is exposed outside the fourth positioning structure 124*c* to engage with the first recesses 216. The first positioning structures 124*b* and the fourth positioning structure 124*c* can be damaged due to the repeated associated operation. The sockets 125*c* and the pins 125*b* can be replaced easier than the protrusions 125 fixed with the base part 10, when they are broken or coating material on them are peeling to cause contamination of wafers. In one embodiment, a height of the upper portion 1251*b* of the pin 125*b* is smaller than a depth of the first recess 216, and a height of the lower portion 1253*b* of the pin 125*b* is smaller than a depth of the recess of the socket 125*c*. Therefore, the sub-elements 21 completely cover the pins 125*b* when the sub-elements 21 are attached to the base part 10. Accordingly, the deposits cannot be deposited around the first recesses 216 and the pins 125*b* in a CVD system. In one of the embodiments, multiple pins 125*b* are also formed in a position corresponding to the inner ring 121, and multiple second recesses 125*a*, and first recesses 216 (not shown) are also formed in a surface (not shown) of the inner ring 121 facing the upper surface 123 to associate with the multiple pins 125*b* respectively, as a replacement of protrusions 125 as shown in FIG. 4. The spacers 40 are used for adjusting a height measured from the upper surface 123 of the base part 10 to the second surface 213 of the sub-element 21 by stacking multiple spacers 40 between the upper surface 123 of the base part 10 and the sub-element 21. In addition, the spacers 40 can also be disposed between the base part 10 and the inner ring 121 to adjust a gap between the base part 10 and the inner ring 121 as shown in FIG. 4. In one embodiment the pin 125*b* can only comprise an upper portion 1251*b* and a lower portion 1253*b* without the middle portion. The geometrical structures of the pin 125*b* are not limited to the embodiments; they can be replaced by different kind of modifications.

Figure 10:
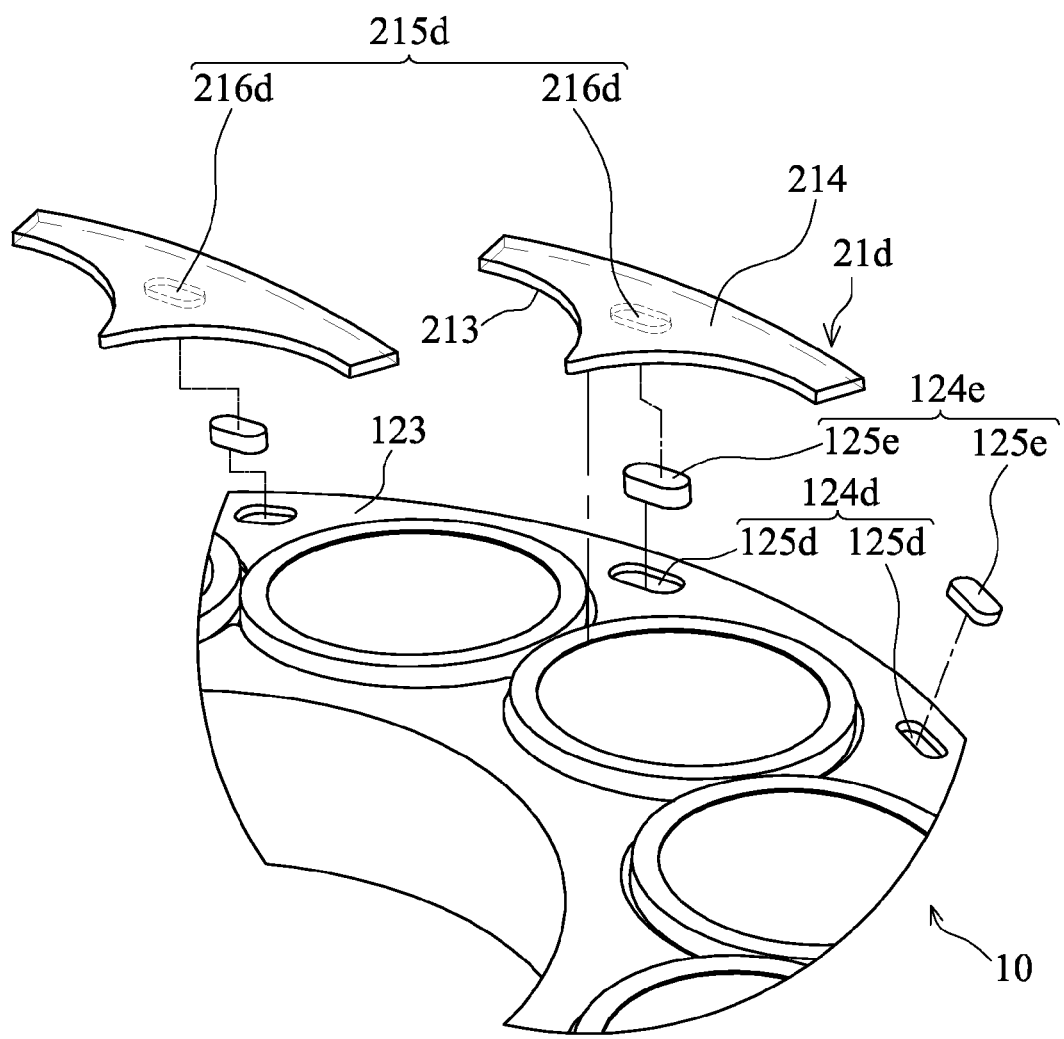
FIG. 10 illustrates a susceptor in accordance with one of the embodiments of the present application.

FIG. 10 illustrates a susceptor in accordance with one of the embodiments of the present application. Referring to FIG. 10, in the present embodiment, a first positioning structure 124*e* comprises multiple oval cylindrical pins 125*e*. The base part 10 further comprises a third positioning structure 124*d* comprising multiple second oval recesses 125*d* formed in the upper surface 123, wherein each oval cylindrical pin 125*e* is associated with each second oval recess 125*d*. A height of the oval cylindrical pin 125*e* is larger than a depth of the second oval recess 125*d*, so part of the oval cylindrical pin 125*e* is exposed outside the second oval recess 125*d*. A second positioning structure 215*d* comprises multiple first oval recesses 216*d* formed in the first surface 213, wherein each sub-element 21*d* is associated with the base part 10 via engaging the second positioning structure 215*d* with the replaceable first positioning structure 124*e* and the third positioning structure 124*d*. In the embodiment, the multiple oval cylindrical pins 125*e* are engaged with the multiple second oval recesses 125*d* at first, and then the multiple oval cylindrical pins 125*e* exposed outside the second oval recess 125*d* can be engaged with first oval recesses 216*d*. The oval cylindrical pins 125*e* have larger area of protrusion surface contact with the second oval recess 125*d*, so damage can be prevent and a longer life cycle can be obtained. In one embodiment, when each oval cylindrical pin 125*e* is associated with each second oval recess 125*d*, a height of the oval cylindrical pin 125*e* exposed outside the second oval recess 125*d* is smaller than a depth of the first oval recess 216*d* and thus the sub-elements 21*d* completely cover the oval cylindrical pin 125*e* when the sub-elements 21*d* are attached to the base part 10. Accordingly, the deposits cannot be deposited around the first oval recesses 216*d* and the oval cylindrical pin 125*e* in a CVD system. In one of the embodiments, multiple oval cylindrical pins 125*e* are also formed in a position corresponding to the inner ring 121, and multiple second oval recesses 125d, and first oval recesses 216d are also formed in a surface of the inner ring 121 facing the upper surface 123 to associate with the multiple oval cylindrical pins 125e respectively, as shown in FIG. 4. The geometrical structures of the oval cylindrical pins 125b are not limited to the embodiments; they can be replaced by different kind of modifications. In one embodiment, the susceptor can further include multiple spacers (not shown) disposed between each sub-element 21d and the base part. Each spacer comprises an oval opening for associating with the oval cylindrical pin 125e.

Figure 11:
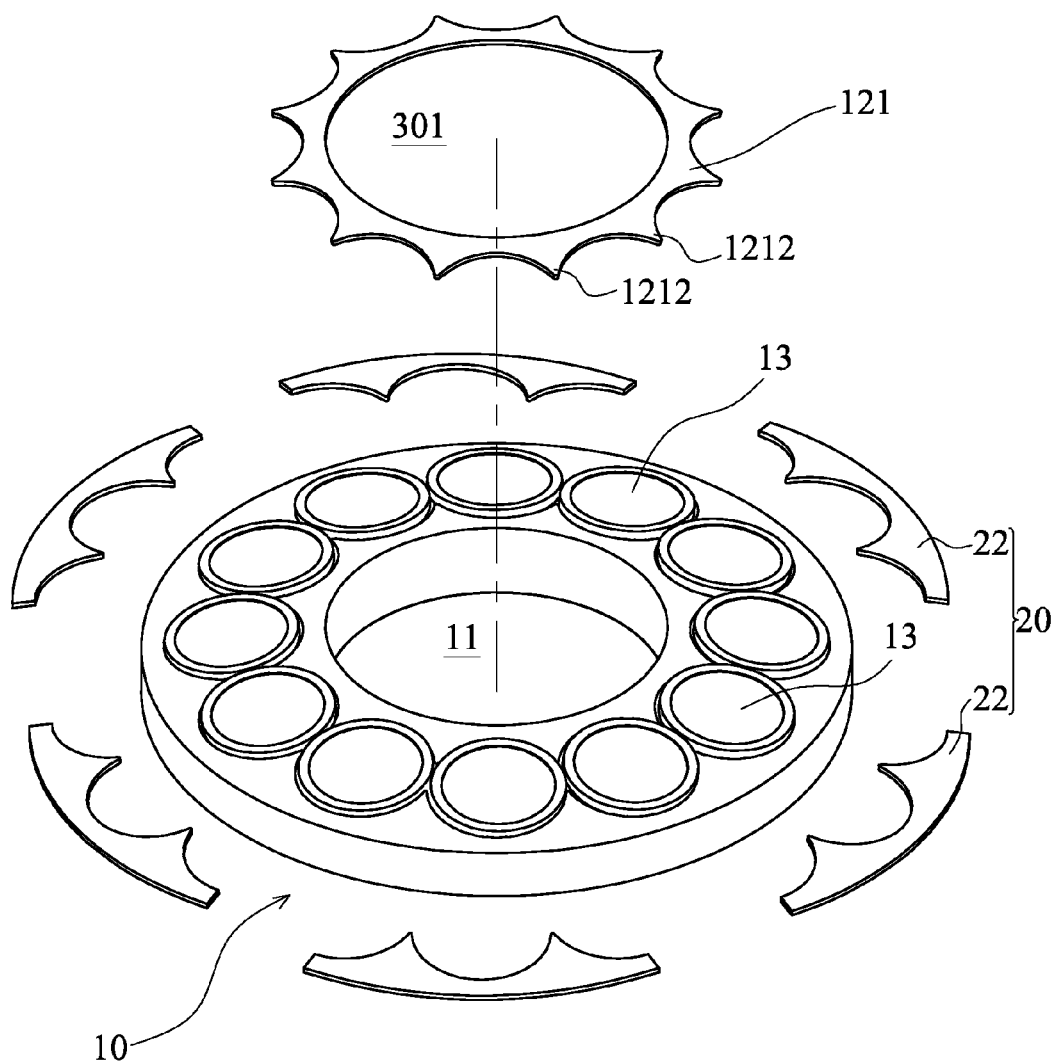
FIG. 11 illustrates a susceptor in accordance with one of the embodiments of the present application.
Figure 12:
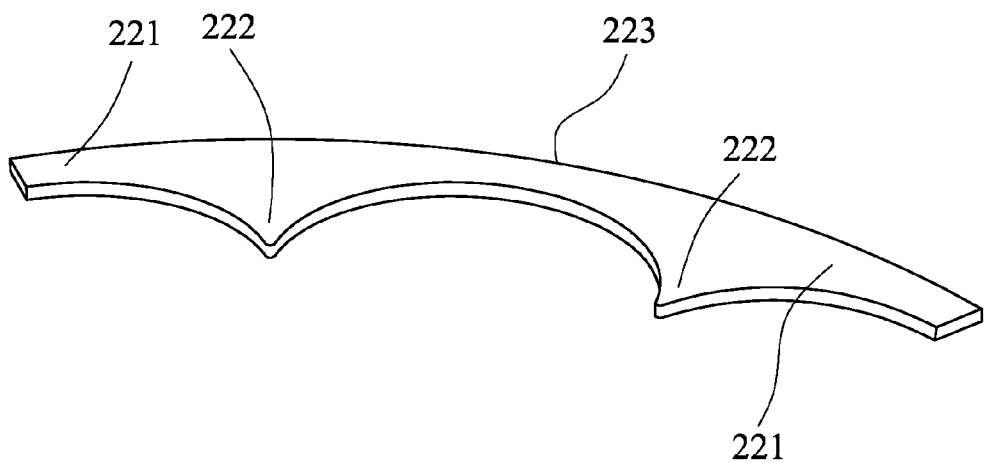
FIG. 12 illustrates a sub-element of a susceptor in accordance with one of the embodiments of the present application
Figure 13:
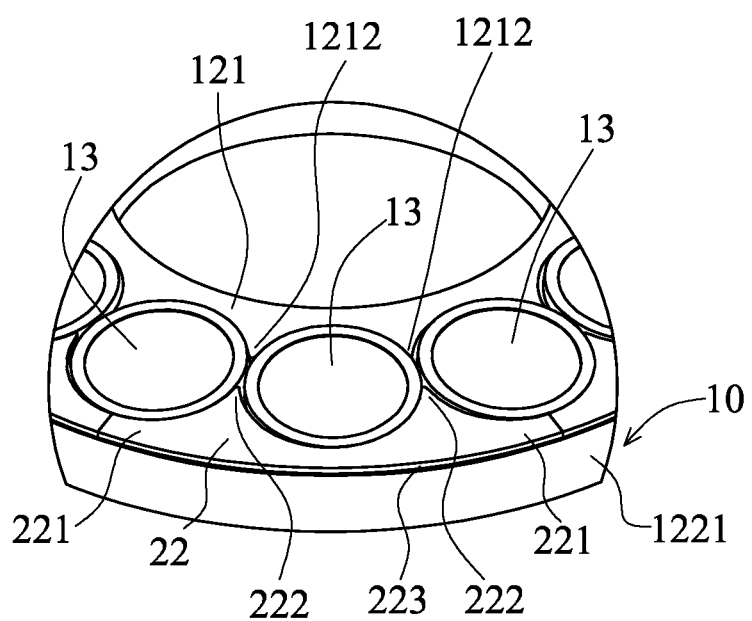
FIG. 13 illustrates an enlarged detail of a susceptor in accordance with one of the embodiments of the present application.

FIG. 11 illustrates a susceptor in accordance with one of the embodiments of the present application. FIG. 12 illustrates a sub-element 22 of a susceptor in accordance with one of the embodiments of the present application. FIG. 13 illustrates an enlarged view of the detail of a susceptor in accordance with one of the embodiments of the present application. Referring to FIG. 11 to FIG. 12, in the present embodiment, each sub-element 22 comprises an outermost edge 223, two tails 221 opposite to each other, and two second extensions 222 each extending radially from the outermost edge 223 toward the inner ring 121 and the through hole 11 and are between the tails 221. Referring to FIG. 13, each holder 13 is partially surrounded by one of the sub-elements 22. The middle holder 13 among the three holders 13 is partially between the two second extensions 222. Other two holders 13 among the three holders 13 are partially surrounded by the two tails 221 respectively. A single sub-element 22 does not surround any one if the holders 13 entirely. The two second extensions 222 of each sub-element 22 aligns with two of the first extensions 1212 of the inner ring 121, so that the sub-elements 22 and the inner ring 121 separate the holders 13 from one another. The curvature of the outermost edge 223 of each sub-element 22 substantially matches the curvature of an outermost side 1221 of the base part 10.

Figure 14:
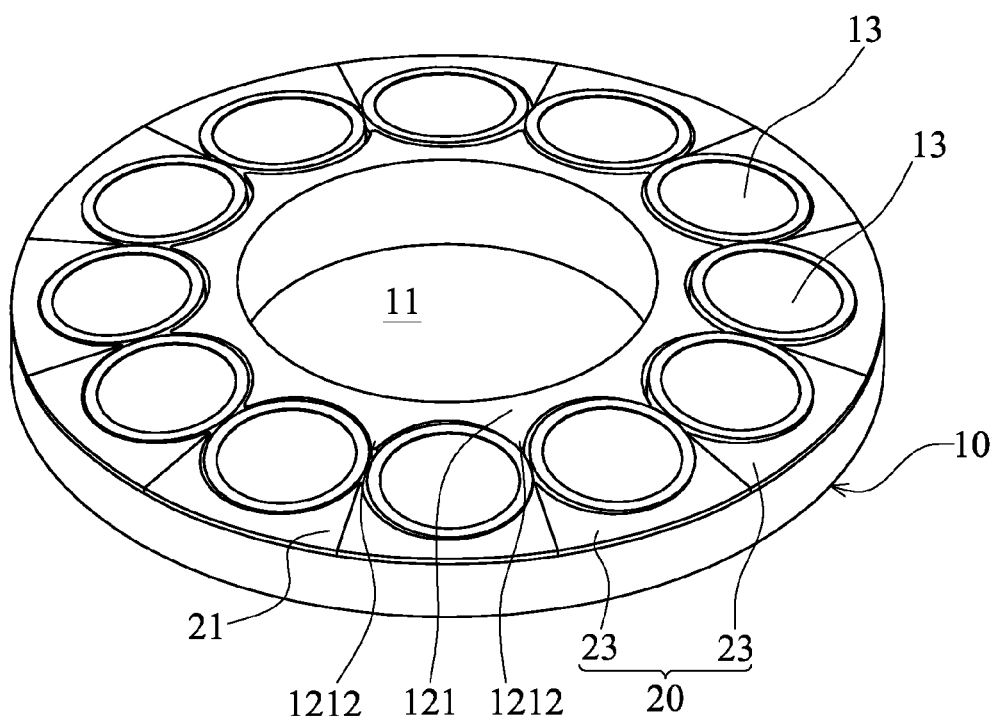
FIG. 14 illustrates a susceptor in accordance with one of the embodiments of the present application.
Figure 15:
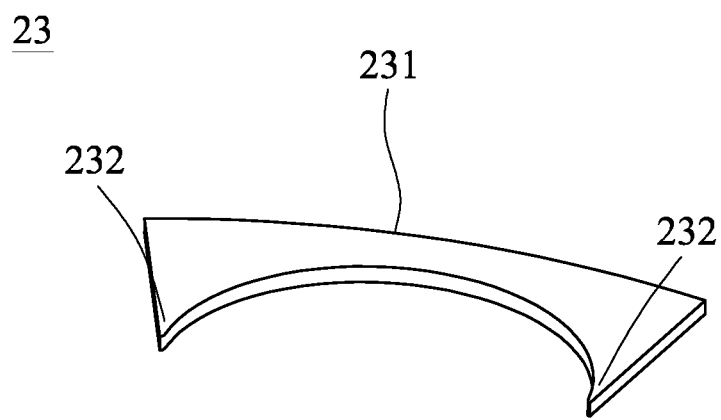
FIG. 15 illustrates a sub-element of a susceptor in accordance with one of the embodiments of the present application.

FIG. 14 illustrates a susceptor in accordance with one of the embodiments of the present application. FIG. 15 illustrates a sub-element 23 of a susceptor in accordance with one of the embodiments of the present application. Referring to FIG. 14 and FIG. 15, in the present embodiment, each sub-element 23 comprises an outermost edge 231 and two second extensions 232 at both ends and extending radially from the outermost edge 231 toward the inner ring 121 and the through hole 11. Referring to FIG. 14, each sub-element 23 neighbors a part of one of the holders 13. The two second extensions 232 of each sub-element 23 aligns with two of the first extensions 1212 of the inner ring 121 so that the sub-elements 23 and the inner ring 121 separate the holders 13 from one another.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:
1. A susceptor, comprising:
   a base part;
   multiple holders distributed on the base part for accommodating wafers;
   a cover comprising a first surface facing the base part, and a second surface opposite to the first surface;
   a first positioning structure;
   a second positioning structure formed in the first surface; and
   a third positioning structure formed in the base part, wherein the cover connects to the base part by associating the first positioning structure with the second positioning structure and the third positioning structure.

2. The susceptor according to claim 1, further comprising a spacer disposed between the cover and the base part.

3. The susceptor according to claim 1, wherein the first positioning structure comprises a pin, and/or the second positioning structure comprising a first recess, and/or the third positioning structure comprising a second recess.

4. The susceptor according to claim 3, wherein the pin comprises an oval cylindrical pin, and the first recess and/or the second recess are oval recesses.

5. The susceptor according to claim 3, wherein the pin comprises an upper portion associated with the first recess, and a lower portion associated with the second recess.

6. The susceptor according to claim 5, further comprising a buffer space between the lower portion and the second recess.

7. The susceptor according to claim 5, wherein the pin further comprises a middle portion formed between the upper portion and the lower portion, and a width of the middle portion is smaller than a width of the upper portion and/or that of the lower portion.

8. The susceptor according to claim 7, further comprising a spacer, wherein the spacer comprises an opening having a diameter substantially the same as that of the middle portion and the opening is associated with the middle portion.

9. The susceptor according to claim 1, further comprising a fourth positioning structure associated with the first positioning structure and third positioning structure.

10. The susceptor according to claim 9, wherein the first positioning structure comprises a pin, the third positioning structure comprising a second recess and the fourth positioning structure comprises a socket associated with the pin and the second recess.

11. The susceptor according to claim 10, wherein the pin comprises an upper portion associated with the first recess, and a lower portion associated with a recess of socket, and wherein a height of the upper portion is smaller than a depth of the first recess, and a height of the lower portion is smaller than a depth of the recess of the socket.

12. The susceptor according to claim 1, wherein the cover separates the holders from one another.

13. The susceptor according to claim 1, wherein the cover further comprises an inner ring and an outer ring detachably connected to the base part and separated from the inner ring.

14. The susceptor according to claim 13, wherein the outer ring comprises multiple sub-elements separated from each other.

15. The susceptor according to claim 14, wherein the second position structure comprises multiple first recesses, each first recess is formed in a surface of each of the sub-elements facing the base part, wherein the third position structure comprises multiple second recesses, each second recess is formed in a surface of the base part facing the sub-elements, and wherein the first position structure comprises multiple pins.

16. The susceptor according to claim 15, wherein each pin is associated with each first recess and each second recess.

17. The susceptor according to claim 16, further comprising multiple spacers disposed between each pin and the base part.

18. The susceptor according to claim 16, wherein each pin comprises an oval cylindrical pin, and each first recess and/or each second recess are oval recesses.

\* \* \* \* \*